United States Patent
Wu

(10) Patent No.: US 12,158,487 B2
(45) Date of Patent: Dec. 3, 2024

(54) VEHICLE POWER SUPPLY CIRCUIT MONITORING SYSTEM AND VEHICLE POWER SUPPLY CIRCUIT MONITORING METHOD

(71) Applicant: Getac Technology Corporation, New Taipei (TW)

(72) Inventor: Ming-Zong Wu, Taipei (TW)

(73) Assignee: Getac Technology Corporation, New Taipei (TW)

( * ) Notice: Subject to any disclaimer, the term of this patent is extended or adjusted under 35 U.S.C. 154(b) by 126 days.

(21) Appl. No.: 18/101,655

(22) Filed: Jan. 26, 2023

(65) Prior Publication Data
US 2024/0125838 A1    Apr. 18, 2024

(30) Foreign Application Priority Data
Oct. 14, 2022  (CN) .......................... 202211260592.1

(51) Int. Cl.
   *G01R 31/00*    (2006.01)
   *G01R 19/165*   (2006.01)

(52) U.S. Cl.
   CPC ..... *G01R 31/006* (2013.01); *G01R 19/16576* (2013.01)

(58) Field of Classification Search
   CPC ........... G06F 17/18; G06F 2009/45591; G06F 1/3206; G06F 1/3203; G06F 1/3265; G06F 1/3262; G06F 11/00; G06F 2113/04; G01R 31/392; G01R 31/389; G01R 31/396; G01R 19/2513; G01R 31/3648; G01R 31/3842; G01R 31/382; G01R 31/36; G01R 31/00; G01R 31/086; G01R 27/18; G01R 31/3647; G01R 31/3646; G01R 31/42;
   (Continued)

(56) References Cited

U.S. PATENT DOCUMENTS 6,472,879 B2 * 10/2002 Park .................... G01R 31/3648
                                                        324/426
6,897,924 B2 *  5/2005 Tashiro ............... G02F 1/13439
                                                        349/113

(Continued)

FOREIGN PATENT DOCUMENTS

CN       200953469 Y     9/2007
CN       104184124 B     9/2017
(Continued)

*Primary Examiner* — Vinh P Nguyen
(74) *Attorney, Agent, or Firm* — Locke Lord LLP; Tim Tingkang Xia, Esq.

(57) ABSTRACT

A vehicle power supply circuit monitoring system and a vehicle power supply circuit monitoring method are provided. The vehicle power supply circuit monitoring system is adapted to a vehicle power supply and a vehicle load device, and includes a power monitoring circuit and a control circuit. The power monitoring circuit is electrically connected to the vehicle power supply and the control circuit. The power monitoring circuit monitors two different input load powers at two different time points. The control circuit calculates an external power loop equivalent impedance according to the two different input load powers. When the external power loop equivalent impedance is greater than a designed impedance threshold, the control circuit executes a warning procedure.

6 Claims, 5 Drawing Sheets

(58) Field of Classification Search
CPC ........ G01R 27/16; G01R 27/08; G01R 21/00; G01R 25/00; G01R 23/02; G01R 22/063; G01R 31/2836; G01R 31/3275; G01R 27/14

See application file for complete search history.

(56) References Cited

U.S. PATENT DOCUMENTS

| | | | | |
|---|---|---|---|---|
| 7,923,966 | B2 * | 4/2011 | Fukuda | G01R 31/389 320/132 |
| 10,938,305 | B2 * | 3/2021 | Shinoda | H02M 3/158 |
| 10,946,865 | B1 | 3/2021 | Lin et al. | |
| 11,644,513 | B1 * | 5/2023 | Ding | H02J 7/005 324/430 |
| 11,652,361 | B1 * | 5/2023 | Matsumoto | B60L 3/0046 307/23 |
| 2015/0001857 | A1 | 1/2015 | Sekiguchi | |
| 2018/0062222 | A1 | 3/2018 | Koch et al. | |
| 2018/0115269 | A1 | 4/2018 | Lin et al. | |
| 2020/0295559 | A1 | 9/2020 | Eaves et al. | |
| 2021/0359504 | A1 | 11/2021 | Mourrier et al. | |
| 2022/0140637 | A1 | 5/2022 | Hosoi et al. | |
| 2022/0229098 | A1 | 7/2022 | Suelzle et al. | |
| 2022/0308612 | A1 | 9/2022 | Muraoka et al. | |

FOREIGN PATENT DOCUMENTS

| | | |
|---|---|---|
| CN | 110126755 A | 8/2019 |
| EP | 2514062 B1 | 11/2017 |
| TW | I629184 B | 7/2018 |
| WO | 2020245519 A1 | 12/2020 |

* cited by examiner

VEHICLE POWER SUPPLY CIRCUIT MONITORING SYSTEM AND VEHICLE POWER SUPPLY CIRCUIT MONITORING METHOD

CROSS-REFERENCE TO RELATED APPLICATIONS

The application claims priority to Chinese Patent Application No. 202211260592.1, filed on Oct. 14, 2022, the disclosure of which is hereby incorporated by reference herein in its entirety.

BACKGROUND OF THE INVENTION

Field of the Invention

The present invention relates to a power supply circuit monitoring system and a monitoring method thereof, and more particularly, to a vehicle power supply circuit monitoring system and a monitoring method thereof.

Description of the Prior Art

Current designs of power supply circuits in vehicles mostly use vehicle power supplies drawn through wires as power sources for operating load devices. However, due to different selections of connection points of vehicle power supplies by users as well as bending and hence breaking of the wire cores, or incorrect means of connecting wires to connection points of vehicle power supplies by users, power loss from the connection points of vehicle power supplies to products through the wires can be resulted.

Thus, the accuracy of a functional mechanism that determines input voltage thresholds of vehicle power supplies may deteriorate, and overly high power loss of wires may also cause risks of short circuitry of power supplies due to excessive aging or melting of the wire coatings. In addition, power that can be actually loaded may also be reduced.

SUMMARY OF THE INVENTION

A technical problem to be solved by the present invention is to provide a vehicle power supply circuit monitoring system and a vehicle power supply circuit monitoring method for the drawbacks of the prior art.

To solve the above technical problems, a vehicle power supply circuit monitoring system is provided according to one technical solution of the present invention. The vehicle power supply circuit monitoring system is adapted to a vehicle power supply and a vehicle load device, and includes a power monitoring circuit and a control circuit. The power monitoring circuit is electrically connected to the vehicle power supply, and monitors a first input load power at a first time point and monitors a second input load power at a second time point. The control circuit is electrically connected to the power monitoring circuit, and calculates an external power loop equivalent impedance according to a difference between the first input load power and the second input load power. When the external power loop equivalent impedance is greater than an impedance threshold, the control circuit executes a warning procedure.

To solve the above technical problems, a vehicle power supply circuit monitoring method is provided according to one technical solution of the present invention. The vehicle power supply circuit monitoring method is performed in a vehicle power supply circuit monitoring system, and includes monitoring a first input load power of a vehicle load device at a first time point, monitoring a second input load power of the vehicle load device at a second time point, calculating an external power loop equivalent impedance according to a difference between the first input load power and the second input load power, and executing a warning procedure when the external power loop equivalent impedance is greater than an impedance threshold.

One of the benefits of the present invention is that, the vehicle power supply circuit monitoring system and the vehicle power supply circuit monitoring method provided by the present invention calculate the external power loop equivalent impedance by means of monitoring a change in the input load power of the vehicle load device, wherein the external power loop equivalent impedance is a total (wires, connectors and terminals) of equivalent impedances of individual nodes in an external power loop of the load. As such, a user is able to estimate an equivalent impedance of the external power loop connected to the load to timely discover any anomalies in the power supply circuit of the vehicle, that is, issues such as loosening, aging or poor contacts between power transmission wires and connectors, so as to further evaluate whether an engine start failure by a vehicle power supply will be caused under a continuous load.

To further understand the features and technical contents of the present invention, the present invention is described in detail with the accompanying drawings below. It should be noted that the drawings provided are for reference and illustration purposes, and are not to be construed as limitations to the present invention.

DETAILED DESCRIPTION OF THE EMBODIMENTS

The implementation related to "a vehicle power supply circuit monitoring system and a vehicle power supply circuit monitoring method" of the present invention are described by way of specific embodiments, and a person skilled in the art would be able to understand the advantages and effects of the present invention on the basis of the disclosure of the present application. The invention is may be implemented or applied by other specific embodiments, and changes and modifications may also be made on the basis of different perspectives and applications to various details in the description without departing from the concept and spirit of the present invention. Moreover, it should be noted that the drawings of the present invention are depicted in brief for illustration purposes, and are not drawn to actual scales. Technical contents associated with the present invention are described in detail below, and it should be noted that the disclosure is not to be construed as limitations to the scope of protection of the present invention.

It is understandable that, although terms such as "first", "second" and "third" are used in the literature to describe various elements or signals, these elements or signals are not to be limited by these terms. These terms are used to differentiate one element from another element, or one signal from another signal. In addition, the term "or" used in the literature may include one or more combinations of related enumerated items depending an actual conditions.

Figure 1:
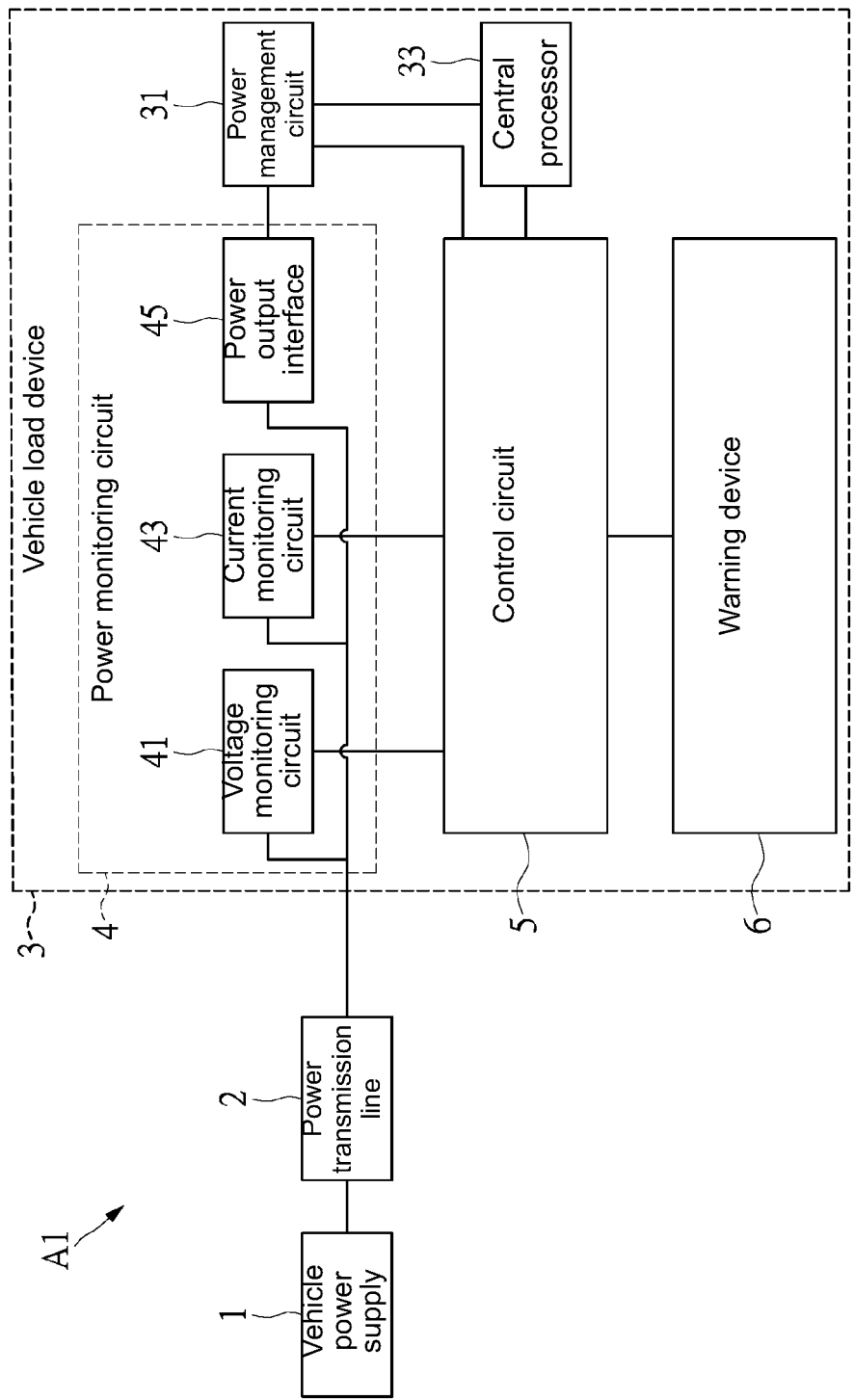
FIG. 1 is a function block diagram of a vehicle power supply circuit monitoring system according to a first embodiment of the present invention.

FIG. 1 shows a function block diagram of a vehicle power supply circuit monitoring system according to a first embodiment of the present invention. As shown in FIG. 1, a vehicle power supply circuit monitoring system A1 is adapted to a vehicle power supply 1, a power transmission line 2 and a vehicle load device 3. The power transmission line 2 has two ends electrically connected to the vehicle power supply 1 and the vehicle load device 3, respectively, and transmits power provided by the vehicle power supply 1 to the vehicle load device 3. The vehicle load device 3 at least includes a power management circuit 31 and a central processor 33. The power management circuit 31 is electrically connected to a power pin of the central processor 33. The power management circuit 31 is configured to convert power from the power transmission line 2, that is, performing power modulation output such as step-up and step-down of the power according to the system design.

The vehicle power supply circuit monitoring system A1 includes a power monitoring system 4, a control circuit 5 and a warning device 6. The power monitoring circuit 4, the control circuit 5 and the warning device 6 are disposed in the vehicle load device 3, wherein the power monitoring device 4 is electrically connected to the power management circuit 31 and the control circuit 5, and the warning device 6 is electrically connected to the control circuit 5.

The power monitoring device 4 includes, for example, a voltage monitoring circuit 41, a current monitoring circuit 43 and a power output interface 45. The voltage monitoring circuit 41, the current monitoring circuit 43 and the power output interface 45 are individually and electrically connected to the power transmission line 2. The power output interface 45 is electrically connected to the power management circuit 31, and receives the power transmitted by the power transmission line 2 and transmits the received power to the power management circuit 31.

The control circuit 5 is, for example, any one of an application specific integrated circuit (ASIC), a programmable field gate array (FPGA), a microcontroller unit (MCU) and a system-on-chip (SoC) or a combination thereof, and may coordinate with other related circuit elements and firmware so as to implement the functions below.

The control circuit 5 has a first signal pin, a second signal pin and a power pin electrically connected to the voltage monitoring circuit 41, the current monitoring circuit 43 and the power management circuit 31, respectively.

The central processor 33 is electrically connected to a third signal pin of the control circuit 5, and the warning device 6 is electrically connected to a fourth pin of the control circuit 5.

The vehicle power supply 1 transmits power to the power monitoring circuit 4 through the power transmission line 2. The voltage monitoring circuit 41 monitors an input load voltage of the vehicle load device 3 every predetermined period, and the current monitoring circuit 43 monitors an input load current of the vehicle load device 3 every predetermined period. For example, the voltage monitoring circuit 41 monitors a first input load voltage of the vehicle load device 3 at a first time point, the current monitoring circuit 43 monitors a first input load current of the vehicle load device 3 at the first time point, and a calculation unit of the power monitoring circuit 4 multiplies the first input load voltage by the first input load current to calculate a first input load power of the vehicle load device 3 at the first time point. After the predetermined period has elapsed, the voltage monitoring circuit 41 monitors a second input load voltage of the vehicle load device 3 at a second time point, the current monitoring circuit 43 monitors a second input load current of the vehicle load device 3 at the second time point, and the calculation unit of the power monitoring circuit 4 multiplies the second input load voltage by the second input load current to calculate a second input load power of the vehicle load device 3 at the second time point.

When the power monitoring circuit 4 monitors the first input load voltage and the first input load current at the first time point, the power monitoring circuit 4 transmits the first input load voltage and the first input load current to the first signal pin and the second pin of the control circuit 5, respectively. When the power monitoring circuit 4 monitors the second input load voltage and the second input load current at the second time point, the power monitoring circuit 4 transmits the second input load voltage and the second input load current to the first signal pin and the second pin of the control circuit 5, respectively.

Once the control circuit 5 obtains the first input load voltage, the first input load current, the second input load voltage and the second input load current, the control circuit calculates an input load voltage difference between the first input load voltage and the second input load voltage and an input load current difference between the first input load current and the second input load current, takes absolute differences of the input load voltage difference and the input load current difference, and divides the absolute value of the input load voltage difference by the absolute value of the input load current difference, so as to calculate an external power loop equivalent impedance.

Once the control circuit 5 has calculated the external power loop equivalent impedance, the control circuit 5 determines whether the external power loop equivalent impedance is greater than an impedance threshold. When the control circuit 5 determines that the external power loop equivalent impedance is greater than the impedance threshold, the control circuit 5 executes a warning procedure, which includes sending a control signal to the warning device 6 by the control circuit 5 so as to activate the warning device 6. For example, the warning device 6 is one single light-emitting diode (LED), which sends out light signals when activated. For example, the warning device 6 is a plurality of LEDs of different colors, and these LEDs of different colors respectively send out different color light signals when activated by the control signal. The warning device 6 is, for example, a beeper, which sends out sound signals when activated. The warning device 6 is, for example, a display screen, which displays text information when activated. Upon observing the light signals, sound signals or text information generated by the warning device 6, a user may start checking whether connection points in a vehicle power loop of a vehicle are damaged, whether power transmission lines are incorrectly connected to connection points of a vehicle power supply, or whether power transmission wires are aged or damaged.

Figure 2:
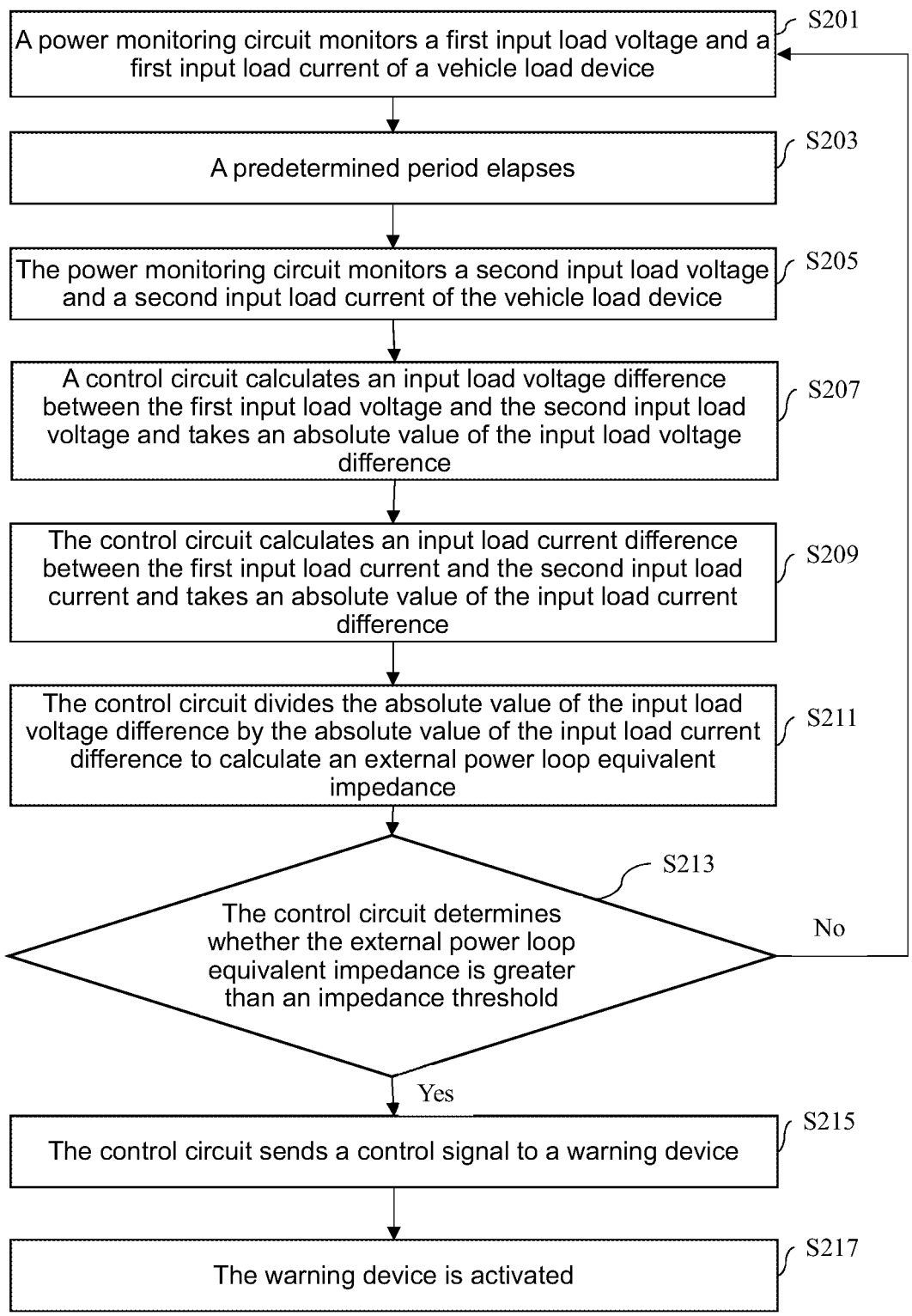
FIG. 2 is a flowchart of a vehicle power supply circuit monitoring method according to the first embodiment of the present invention.

FIG. 2 shows a flowchart of a vehicle power supply circuit monitoring method according to the first embodiment of the present invention. The vehicle power supply circuit monitoring method in FIG. 2 can be performed by, for example but not limited to, the vehicle power supply circuit monitoring system A1 in FIG. 1.

As shown in FIG. 2, in step S201, a power monitoring circuit 4 monitors a first input load voltage and a first input load current of a vehicle load device 3. In step S203, a predetermined period elapses. In step S205, the power monitoring circuit 4 monitors a second input load voltage and a second input load current of the vehicle load device 3. In step S207, a control circuit 5 calculates an input load voltage difference between the first input load voltage and the second input load voltage, and takes an absolute value of the input load voltage difference. In step S209, the control circuit 5 calculates an input load current difference between the first input load current and the second input load current, and takes an absolute value of the input load current difference. In step S211, the control circuit 5 divides the absolute value of the input load voltage difference by the absolute value of the input load current difference to calculate an external power loop equivalent impedance. In step S213, the control circuit 5 determines whether the external power loop equivalent impedance is greater than an impedance threshold. When the control circuit 5 determines that the external power loop equivalent impedance is greater than the impedance threshold, the control circuit 5 executes a warning procedure, which includes step S215 to step S217. When the control circuit 5 determines that the external power loop equivalent impedance is not greater than the impedance threshold, the method returns to step S201. In step S215, the control circuit 5 sends a control signal to a warning device 6, and step S217 follows. In step S217, the warning device 6 is activated.

Figure 3:
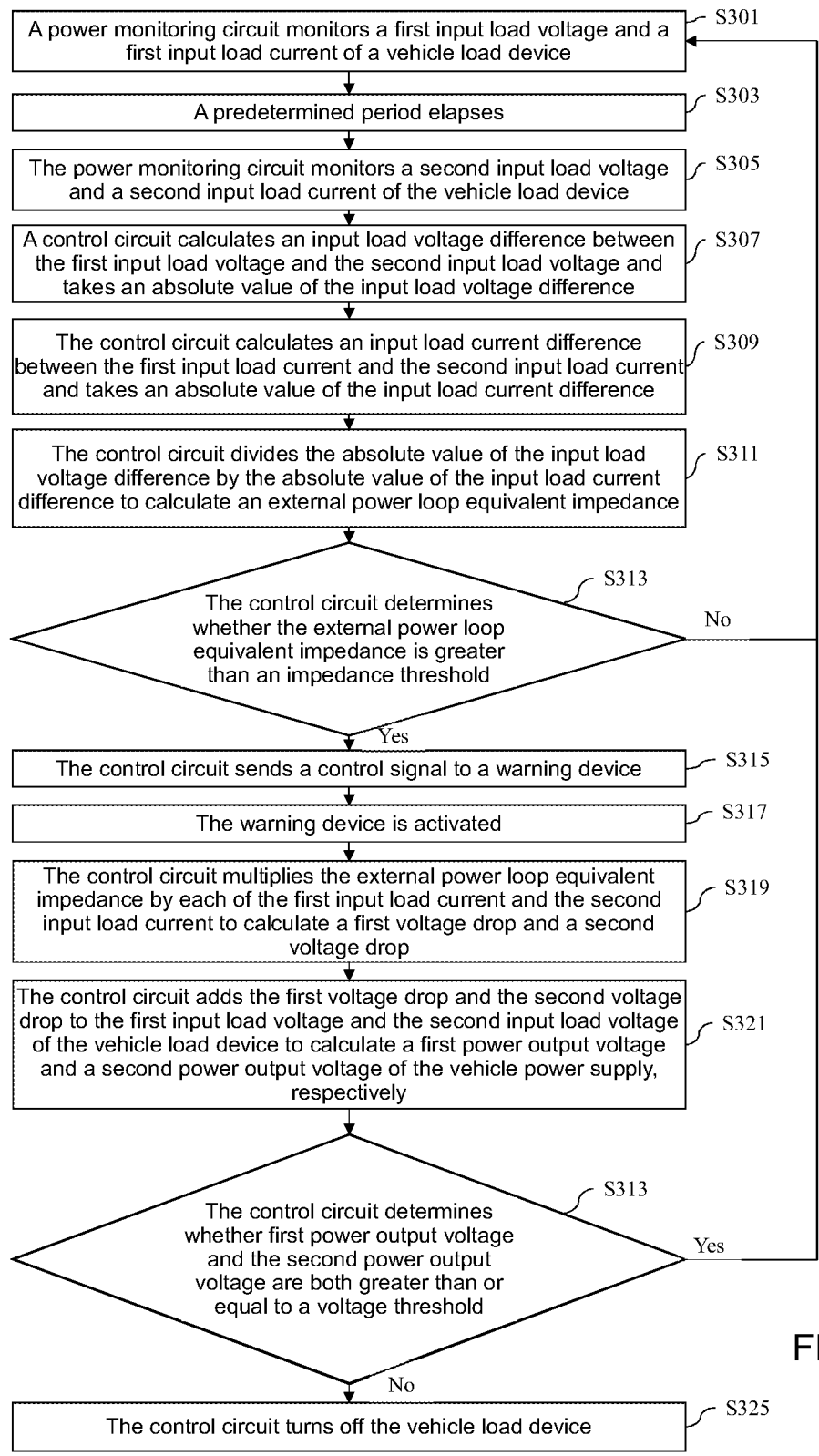
FIG. 3 is a flowchart of a vehicle power supply circuit monitoring method according to a second embodiment of the present invention.

FIG. 3 shows a flowchart of a vehicle power supply circuit monitoring method according to a second embodiment of the present invention. The vehicle power supply circuit monitoring method in FIG. 3 can be performed by, for example but not limited to, the vehicle power supply circuit monitoring system A1 in FIG. 1.

Step S301 to step S317 of the vehicle power supply circuit monitoring method in FIG. 3 are identical to step S201 to step S217 of the vehicle power supply circuit monitoring method in FIG. 2, with a difference being that the warning procedure further includes step S319 to step S325. In step S319, the control circuit 5 multiplies the external power loop equivalent impedance by each of the first input load current and the second input load current to calculate a first voltage drop and a second voltage drop. In step S321, the control circuit 5 adds the first voltage drop and the second voltage drop to the first input load voltage and the second input load voltage of the vehicle load device 3, respectively, to calculate a first power output voltage and a second power output voltage of a vehicle power supply 1. In step S323, the control circuit 5 determines whether the first power output voltage and the second power output voltage are both greater than or equal to a voltage threshold. When the control circuit 5 determines that the first power output voltage and the second power output voltage are both greater than or equal to the voltage threshold, the method returns to step S301. When the control circuit 5 determines that the first power output voltage and the second power output voltage are both not greater than or equal to the voltage threshold, step S325 follows. In step S325, the control circuit 5 turns off the vehicle load device 3. When the vehicle load device 3 is turned off, the vehicle load device 3 does not consume power of the vehicle power supply 1, so that the vehicle power supply 1 can keep power sufficient to start a vehicle engine.

Two actual examples of the vehicle power supply circuit monitoring system and the vehicle power supply circuit monitoring method are described below. It should be noted that these examples only demonstrate a method in which a maximum load power of the system design corresponds to critical designed value of an external power loop impedance that can be adapted to.

In the first actual example, the power monitoring circuit 4 monitors at the first time point that the first input load voltage and the first input load current are 14.47 V and 0.1 A, respectively, and calculates, according to an instantaneous power calculation equation, that a first input load power of the vehicle load device 3 at the first time point is: 14.47 V*0.1 A=1.447 W.

The power monitoring circuit 4 monitors at the second time point that the second input load voltage and the second input load current are 12.0001 V and 8.333 A, respectively, and calculates, according to the instantaneous power calculation equation, that a second input load power of the vehicle load device 3 at the second time point is: 12.0001 V*8.333 A=99.996 W.

An absolute value of the input load voltage difference between the first input load voltage and the second input load voltage is: ABS (14.47 V−12.0001 V)=2.4699 V.

An absolute value of the input load current difference between the first input load current and the second input load current is: ABS (0.1 A−8.333 A)=8.233 A.

According to the absolute value of the input load voltage difference and the absolute value of the input load current difference, an external power loop equivalent impedance can be calculated, wherein the external power loop equivalent impedance is: 2.4699 V/8.233 A=0.3 ohm.

According to the instantaneous power calculation equation and Kirchhoff's current law, an external power loop power loss at the first time point and an external power loop power loss at the second time point can be calculated, wherein the external power loop power loss at the first time point is: 0.1 A*0.1 A*0.3 ohm=0.03 W, and the external power loop power loss at the second time point is: 8.333 A*8.333 A*0.3 ohm=20.831 W.

In the second actual example, the power monitoring circuit 4 monitors at the first time point that the first input load voltage and the first input load current are 12.47 V and 0.1 A, respectively, and monitors at the second time point that the second input load voltage and the second input load current are 8 V and 15 A, respectively.

An absolute value of the input load voltage difference between the first input load voltage and the second input load voltage is: ABS (12.47 V−8 V)=4.47 V.

An absolute value of the input load current difference between the first input load current and the second input load current is: ABS (0.1 A−15 A)=14.9 A.

The external power loop equivalent impedance is: 4.47 V/14.9 A=0.3 ohm.

The first voltage drop of the external power loop equivalent impedance at the first time point is: 0.1 A*0.3 ohm=0.03 V, and the second voltage drop of the external power loop equivalent impedance at the second time point is: 15 A*0.3 ohm=4.5V.

According to the first voltage drop of the external power loop equivalent impedance at the first time point and the first input load voltage of the vehicle load device 3 at the first time point, it can be calculated that the first power output voltage of the vehicle power supply 1 at the first time point is: 0.03 V+12.47 V=12.5 V.

According to the second voltage drop of the external power loop equivalent impedance at the second time point and the second input load voltage of the vehicle load device 3 at the second time point, it can be calculated that the second power output voltage of the vehicle power supply 1 at the second time point is: 4.5 V+8 V=12.5 V.

Because both of the first power output voltage and the second power output voltage are greater than a designed voltage threshold (12 V), a vehicle engine start failure will not be caused in a continuous load state, so the vehicle load device 3 does not need to be turned off.

Figure 4:
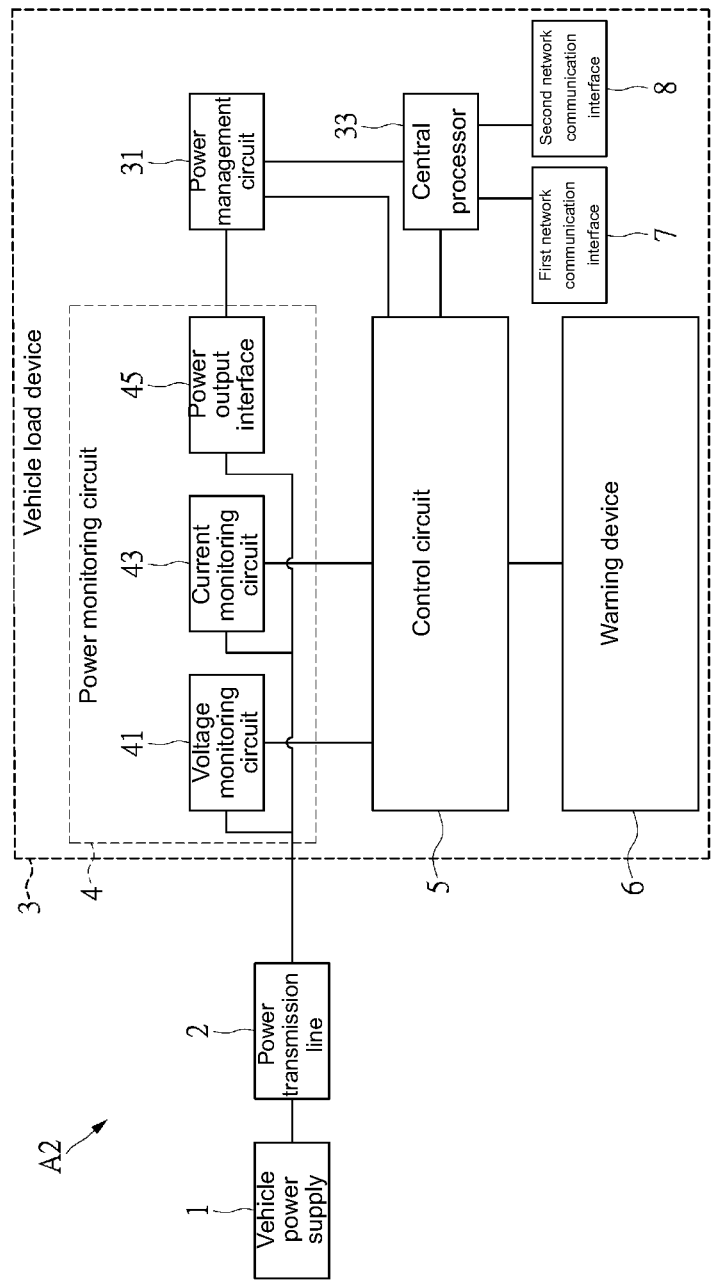
FIG. 4 is a function block diagram of a vehicle power supply circuit monitoring system according to the second embodiment of the present invention.

FIG. 4 shows a function block diagram of a vehicle power supply circuit monitoring system according to the second embodiment of the present invention. A vehicle power supply circuit monitoring system A2 of the second embodiment differs from the vehicle power supply circuit monitoring system A1 (in FIG. 1) of the first embodiment in that, the vehicle power supply circuit monitoring system A2 further includes a first network communication interface 7 and a second network communication interface 8. The first network communication interface 7 and the second network communication interface 8 are a WI-FI interface and a wired network interface, respectively, and are electrically and respectively connected to the central processor 33. When the control circuit 5 determines that the external power loop equivalent impedance is greater than the impedance threshold, the control circuit 5 executes a warning procedure, which includes sending a control signal to the central processor 33 by the control circuit 5, and sending a warning signal to an external terminal device by the central processor 33 through the first network communication interface 7 or the second network communication interface 8. The external terminal device is, for example, a mobile communication device of a user or a server.

Figure 5:
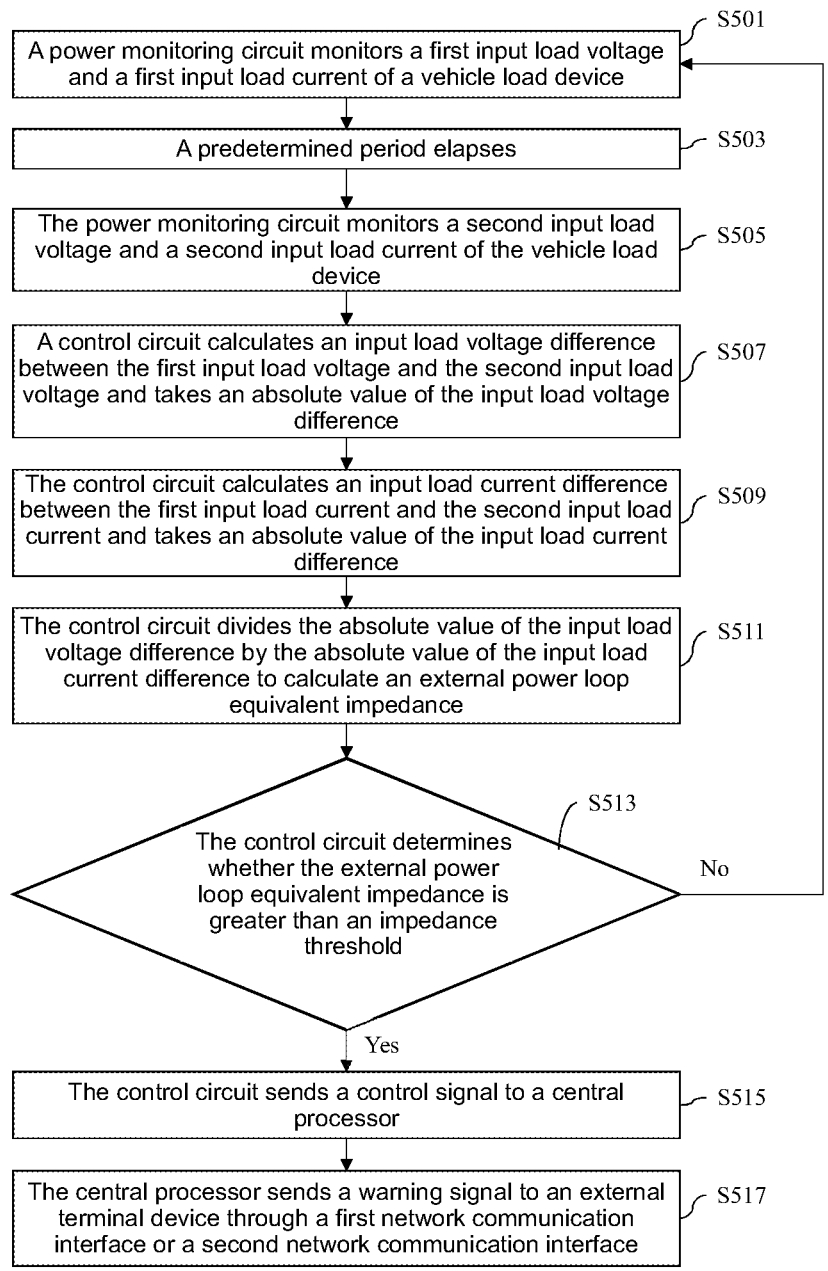
FIG. 5 is a flowchart of a vehicle power supply circuit monitoring method according to a third embodiment of the present invention.

FIG. 5 shows a flowchart of a vehicle power supply circuit monitoring method according to a third embodiment of the present invention. The vehicle power supply circuit monitoring method in FIG. 5 can be performed by, for example, the vehicle power supply circuit monitoring system A2 in FIG. 4. As shown in FIG. 5, in step S501, a power monitoring circuit 4 monitors a first input load voltage and a first input load current of a vehicle load device 3. In step S503, a predetermined period elapses. In step S505, the power monitoring circuit 4 monitors a second input load voltage and a second input load current of a vehicle load device 3. In step S507, a control circuit 5 calculates an input load voltage difference between the first input load voltage and the second input load voltage, and takes an absolute value of the input load voltage difference. In step S509, the control circuit 5 calculates an input load current difference between the first input load current and the second input load current, and takes an absolute value of the input load current difference. In step S511, the control circuit 5 divides the absolute value of the input load voltage difference by the absolute value of the input load current difference to calculate an external power loop equivalent impedance. In step S513, the control circuit 5 determines whether the external power loop equivalent impedance is greater than an impedance threshold. When the control circuit 5 determines that the external power loop equivalent impedance is greater than the impedance threshold, the control circuit 5 executes a warning procedure, which includes step S515 to step S517. When the control circuit 5 determines that the external power loop equivalent impedance is not greater than the impedance threshold, the method returns to step S501. In step S515, the control circuit 5 sends a control signal to the central processor 33. In step S517, the central processor 33 sends a warning signal to an external terminal device through a first network communication interface 7 or a second communication interface 8.

Benefits of the Embodiments

One of the benefits of the present invention is that, the vehicle power supply circuit monitoring system and the vehicle power supply circuit monitoring method provided by the present invention calculate the external power loop equivalent impedance by means of monitoring a change in the input load power of the vehicle load device, wherein the external power loop equivalent impedance is an equivalent impedance of the power supply circuit. As such, a user is able be estimate the external power loop equivalent impedance to timely discover any anomalies in the power supply circuit of the vehicle as well as issues such as loosening, aging or poor contacts between power transmission wires and connectors, so as to further evaluate whether an engine start failure by a vehicle power supply will be caused under a continuous load of vehicle electronic devices.

The disclosure above are merely preferred feasible embodiments of the present invention and is not to be construed as limitations to the scope of claims of the present invention. It should be noted that all equivalent technical variations made to the description and the drawings of the present invention are to be encompassed within the scope of claims of the present invention.

What is claimed is:

1. A vehicle power supply circuit monitoring system, adapted to a vehicle power supply and a vehicle load device, the vehicle power supply circuit monitoring system comprising:
   a power monitoring circuit electrically connected to the vehicle power supply and comprising:
   a voltage monitoring circuit monitoring a first input load voltage to the vehicle load device at a first time point and a second input load voltage to the vehicle load device at a second time point; and
   a current monitoring circuit monitoring a first input load current to the vehicle load device at the first time point and a second input load current to the vehicle load device at the second time point; and
   a control circuit electrically connected to the power monitoring circuit, the control circuit calculating an external power loop equivalent impedance by dividing an absolute value of a difference between the first input load voltage to the vehicle load device and the second input load voltage to the vehicle load device by an absolute value of a difference between the first input load current to the vehicle load device and the second input load current to the vehicle load device, and the control circuit executing a warning procedure when the external power loop equivalent impedance is greater than an impedance threshold.

2. The vehicle power supply circuit monitoring system according to claim 1, further comprising:
   a warning device electrically connected to the control circuit, wherein the warning procedure comprises sending a control signal to the warning device by the control circuit so as to activate the warning device.

3. The vehicle power supply circuit monitoring system according to claim 1, further comprising:
   a network communication interface electrically connected to a central processor of the vehicle load device, wherein the central processor is electrically connected to the control circuit, the warning procedure comprises sending a control signal to the central processor by the control circuit, and the central processor sends a warning signal to an external terminal device through the network communication interface.

4. The vehicle power supply circuit monitoring system according to claim 1, further adapted to a power transmission line, wherein the power transmission line has two ends respectively connected to a vehicle power supply and the power monitoring circuit, and the power monitoring circuit monitors power provided by the power transmission line.

5. A vehicle power supply circuit monitoring method, performed in a vehicle power supply circuit monitoring system, the vehicle power supply circuit monitoring method comprising:

monitoring a first input load voltage and a first input load current of a vehicle load device at a first time point;

monitoring a second input load voltage and a second input load current of the vehicle load device at a second time point;

calculating an external power loop equivalent impedance by dividing an absolute value of a difference between the first input load voltage to the vehicle load device and the second input load voltage to the vehicle load device by an absolute value of a difference between the first input load current to the vehicle load device and the second input load current to the vehicle load device; and executing a warning procedure when the external power loop equivalent impedance is greater than an impedance threshold.

6. The vehicle power supply circuit monitoring method according to claim 5, further comprising:

calculating a first voltage drop by multiplying the first input load current by the external power loop equivalent impedance;

calculating a second voltage drop by multiplying the second input load current by the external power loop equivalent impedance;

calculating a first power output voltage by adding the first voltage drop to the first input load voltage;

calculating a second power output voltage by adding the second voltage drop to the second input load voltage; and turning off the vehicle load device when both of the first power output voltage and the second power output voltage are not greater than or equal to a voltage threshold.

* * * * *